United States Patent [19]
Yamaguchi

[11] Patent Number: 5,157,475
[45] Date of Patent: Oct. 20, 1992

[54] SEMICONDUCTOR DEVICE HAVING A PARTICULAR CONDUCTIVE LEAD STRUCTURE

[75] Inventor: Tadashi Yamaguchi, Tokyo, Japan

[73] Assignee: Oki Electric Industry Co., Ltd., Tokyo, Japan

[21] Appl. No.: 635,636

[22] PCT Filed: Jul. 6, 1989

[86] PCT No.: PCT/JP89/00682
§ 371 Date: Jan. 7, 1991
§ 102(e) Date: Jan. 7, 1991

[87] PCT Pub. No.: WO90/00813
PCT Pub. Date: Jan. 25, 1990

[30] Foreign Application Priority Data
Jul. 8, 1988 [JP] Japan ............... 63-168834
Mar. 20, 1989 [JP] Japan ............... 1-68894

[51] Int. Cl.$^5$ ............... H01L 23/48; H01L 23/30; H01L 23/50
[52] U.S. Cl. ............... 357/68; 357/72
[58] Field of Search ............... 357/70, 80, 68, 72

[56] References Cited
U.S. PATENT DOCUMENTS
3,964,093 6/1976 Coucoulas ............... 357/69
4,099,200 7/1978 Koutalides ............... 357/69
4,864,383 9/1989 Gloton et al. ............... 357/68

Primary Examiner—Rolf Hille
Assistant Examiner—S. V. Clark
Attorney, Agent, or Firm—Edward D. Manzo

[57] ABSTRACT

A thin semiconductor device comprises a die pad (52) having a first thickness, a semiconductor chip (51) mounted on the die pad (52), a plurality of conductive leads (54) each having at least a portion having a second thickness greater than the first thickness, and conductors (53) interconnecting the semiconductor chip (51) and the leads (54). The semiconductor device is sealed in a resin molding having the second thickness with portions of the leads (54) exposed. In sealing the semiconductor device in the resin molding by molding, the semiconductor device is held between the upper and lower dies of a molding die defining a cavity having a thickness equal to the second thickness to prevent the melted resin (55) from flowing and forming a thin film over the surfaces of the leads to be exposed. In modification, an extended portion having the second thickness of each lead (54) is extended toward the adjacent lead (54) and is bent, and insulating reinforcing members are held by the extended portions of the leads to prevent the separation of the leads from the resin molding and to improve the mechanical strength of the semiconductor device.

14 Claims, 16 Drawing Sheets

Fig. 11a
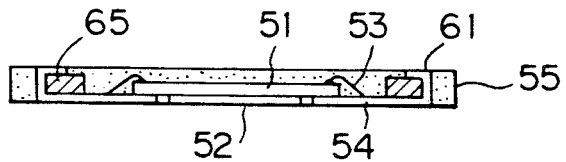
Fig. 11b          Fig. 11c
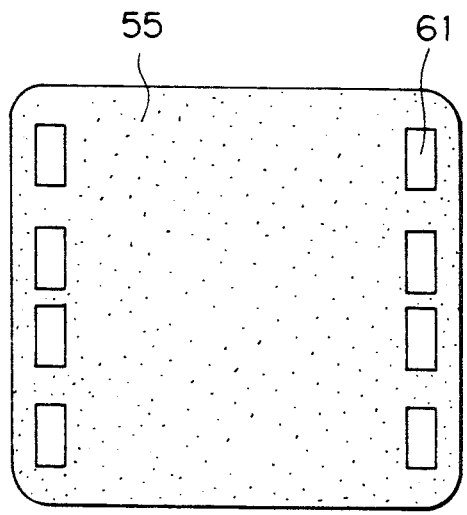     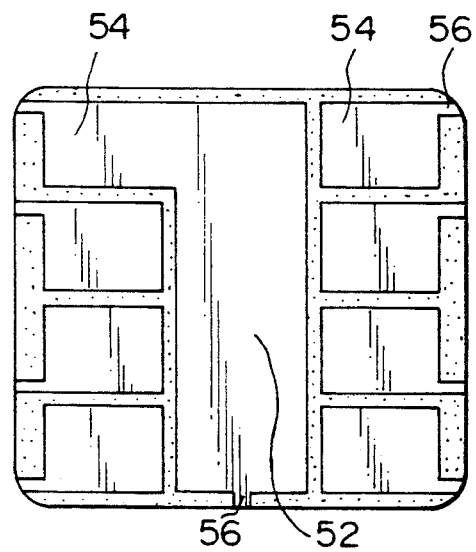
Fig. 13a          Fig. 13b
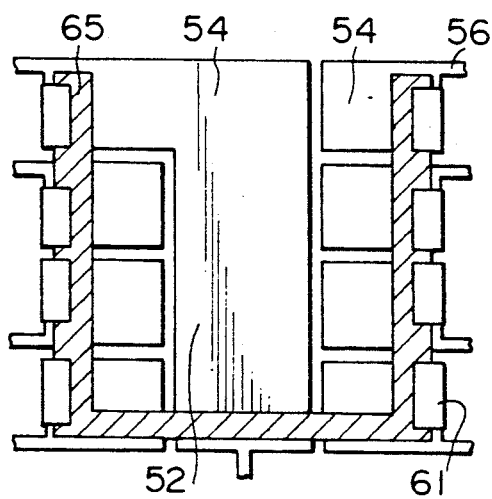     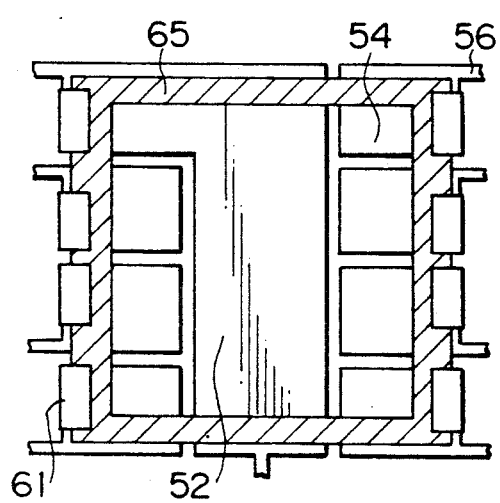

SEMICONDUCTOR DEVICE HAVING A PARTICULAR CONDUCTIVE LEAD STRUCTURE

DESCRIPTION

1. Technical Field

The present invention relates to a resin-sealed, thin semiconductor device, such as an IC card.

2. Background Art

Semiconductor devices for watches, cameras and IC cards are required to be formed in a very thin package having a thickness, for example, in the range of about 0.5 to about 2 mm.

Such semiconductor devices are disclosed in Japanese Patent laid-open Nos. 55-56647 (Reference 1) and 62-261498 (Reference 2).

The semiconductor device disclosed in Reference 1 is shown in FIGS. 1(a), 1(b), 2(a) and 2(b). FIGS. 1(a) and 2(a) are plan views and FIGS. 1(b) and 2(b) are sectional views of the semiconductor device, in which like parts are denoted by the same reference characters throughout.

The semiconductor device shown in FIGS. 1(a) and 1(b) employs a printed circuit board (hereinafter abbreviated to "PCB") 1 formed of a glass cloth base epoxy resin laminate and provide with leads 1a and 1b formed of metal films in desired patterns on the opposite sides thereof, respectively. A semiconductor chip 2 mounted on the PCB 1 is connected to the leads 1a with wires 3. The semiconductor chip 2 and the wires 3 are sealed in a sealing material 4, such as an epoxy resin, to form a so-called chip-on-board (COB) semiconductor device. The leads 1b formed on the backside of the PCB 1 are connected electrically to an external device.

The semiconductor device shown in FIGS. 2(a) and 2(b) is of a two-layer stacked construction having two PCBs 1-1 and 1-2. A semiconductor chip 2 is fixedly seated in a recess 1c formed in the upper surface of the lower PCB 1-1 and sealed in a sealing material 4. The outer surface of the upper PCB 1-2 forming the upper surface of this semiconductor device is flat. The outer surface of the sealing material 4 can be formed flush with the outer surface of the upper PCB 1-2, and the semiconductor chip 2 is seated in the recess 1c so that the semiconductor device is formed in a relatively small thickness. Such a construction is suitable for a thin semiconductor device having flat surfaces, such as an IC card.

The semiconductor devices of FIGS. 1(a) and 2(a), however, employ the expensive PCB 1, and the PCBs 1-1 and 1-2, respectively, as the principle components, and the use of the two PCBs 1-1 and 1-2 as best shown in FIG. 2(b) further increases the manufacturing cost of the semiconductor device. Semiconductor devices employing lead frames as shown in FIGS. 3(a), 3(b), 4(a) and 4(b) are proposed in Reference 2.

FIGS. 3(a) and 3(b) are a plan view and a sectional view, respectively, of the semiconductor device proposed in Reference 2. This semiconductor device employs a lead frame having a die pad 10a and a plurality of leads 10b. A semiconductor chip 11 is fixed to the die pad 10a and is connected electrically with wires 12 to the leads 10b. The lead frame thus mounted with the semiconductor chip 11 is held between the upper and lower dies of a molding die, not shown, and is sealed in a sealing material 13 by molding.

FIG. 4(a) is a perspective view of a lead frame employed in a conventional semiconductor device for an IC card, and FIG. 4(b) is a perspective view of an IC card incorporating the lead frame of FIG. 4(a).

Referring to FIG. 4(a), the terminals 20a of a lead frame 20 are formed by pressing or embossing so as to protrude by a height in the range of 20 to 300 μm from a plane including the upper surfaces of leads 20b. The lead frame 20 is combined with a laminated film 22 with the terminals 20a fitted in through holes formed in the laminated film 22, and then the laminated film 22 is applied to a card 21 to construct an IC card having flat surfaces as shown in FIG. 4(b).

These semiconductor devices employing the lead frames shown in FIGS. 3(a) and 4(a), however, have the following disadvantages.

(a) In sealing the semiconductor device by molding, the leads of the lead frame cannot be held between the upper and lower dies of the molding die in perfect contact with the inner surfaces of the upper and lower dies and, consequently, the sealing material injected into the cavity of the molding die spreads over the surfaces of the leads in thin films which caused troubles in the practical use of the semiconductor device.

(b) The adhesion of the sealing material to the leads is greatly dependent on the adhesive strength of the sealing material with respect to the leads and hence the sealing material separates from the leads under some ambient conditions.

(c) Portions of the sealing material filling up spaces between the leads have relatively low mechanical strength, and hence it is possible that those portions will fissure.

Accordingly, it is an object of the present invention to provide an inexpensive semiconductor device eliminating those disadvantages of the conventional semiconductor devices, such as the formation of thin films of the sealing material over the surfaces of the leads, the separation of the sealing material from the leads due to the insufficient adhesive strength between the sealing material and the leads, and the insufficient mechanical strength of the portions of the sealing material filling up the spaces between the leads.

DISCLOSURE OF THE INVENTION

In one aspect of the present invention, a semiconductor device comprises: a die pad of a first thickness; a semiconductor chip mounted on the die pad; a plurality of separate leads formed around the semiconductor chip and each having at least a portion having a second thickness greater than the first thickness; a plurality of conductors connecting the semiconductor chip to the leads; and a sealing material spread in the second thickness so as to seal the die pad, the semiconductor chip, the leads and the conductors with portions of the upper and lower surfaces of each leads uncovered with the sealing material. In sealing those components of this semiconductor device by the sealing material, the upper and lower dies can be pressed against the semiconductor device to form a cavity of a thickness dependent on the second thickness of the leads and hence the sealing material injected into the cavity is unable to flow over the surfaces of the portions having the second thickness of the leads to form a thin film over the same surfaces.

Since the portion having the second thickness of each lead is formed by bending an extended portion of the lead, the semiconductor device can be fabricated easily at a relatively low cost. Since the extended portion of each lead is extended toward the adjacent lead, the separation of the lead from the sealing material and the fissuring of the sealing material can be prevented, so that the mechanical strength of the semiconductor device can be enhanced.

In another aspect of the present invention, a semiconductor device comprises: a die pad; a semiconductor chip mounted on the die pad; a plurality of conductive leads formed around the semiconductor chip and separate from the semiconductor chip; conductors connecting the semiconductor chip to the leads; one or a plurality of insulating reinforcing members held together with the leads; extended portions of the conductive leads bent so as to hold the insulating reinforcing member or members; and sealing material sealing the die pad, the semiconductor chip, the leads, the extended portions of the leads, and the insulating reinforcing member or members with a portion of each lead and a portion of the extended portion of each lead uncovered. Since the extended portions of the leads are bent upright so as to hold the insulating reinforcing members securely between the extended portions, and the upper and lower dies are pressed against the semiconductor device so that the inner surfaces of the upper and lower dies are in close contact with the extended portions, in sealing the semiconductor device by the sealing material by molding. the sealing material is unable to flow over the exposed surfaces of the leads or the extended portions to form a thin film. The insulating reinforcing members enhances the mechanical strength of the semiconductor device, and the separation of the leads from the sealing material is prevented because the leads are held fixedly in place by the insulating reinforcing members.

BRIEF DESCRIPTION OF THE DRAWINGS

FIGS. 11(a) to 11(c) are a top plan view, a bottom plan view and a sectional view of a semiconductor device in a fourth embodiment according to the present invention;

FIGS. 13(a) and 13(b) are plan views of insulating reinforcing members for semiconductor devices in further embodiments according to the present invention.

In the drawings, like parts are denoted by the same reference characters.

BEST MODE FOR CARRYING OUT THE INVENTION

The present invention will be described in detail hereinafter with reference to the accompanying drawings.

Figure 1A:
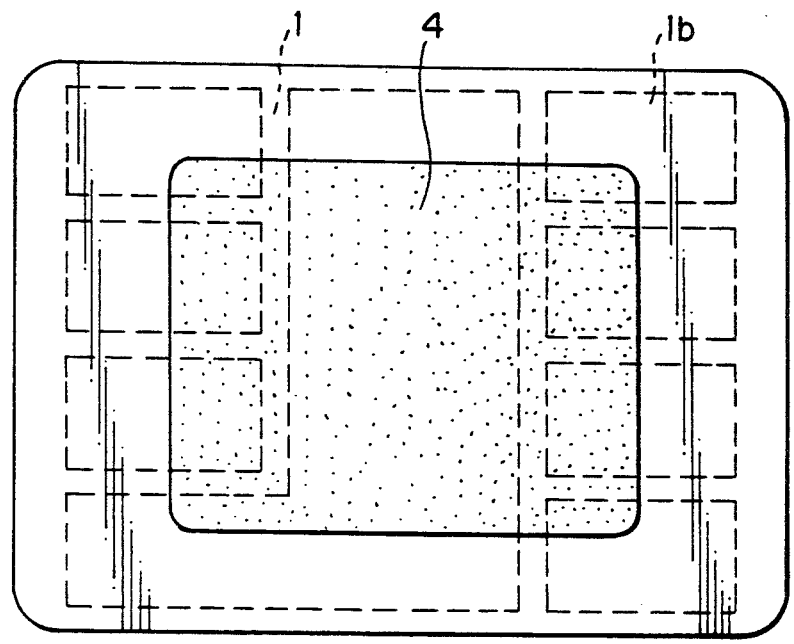
FIGS. 1(a), 2(a), 3(a) and 4(a) are plan view of conventional semiconductor devices.
Figure 1B:
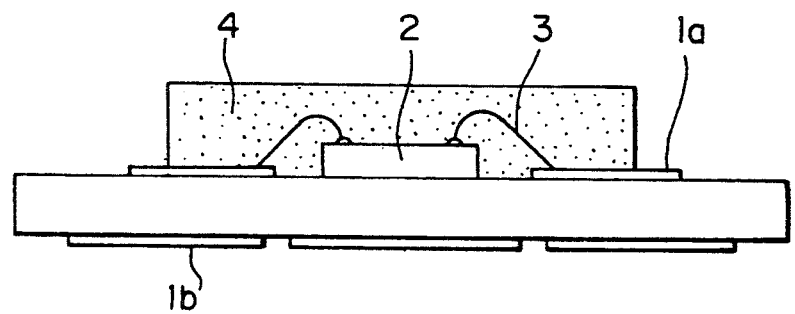
FIGS. 1(b), 2(b), 3(b) and 4(b) are sectional views of the conventional semiconductor devices of FIGS. 1(a), 2(a), 3(a) and 4(a), respectively.
Figure 2A:
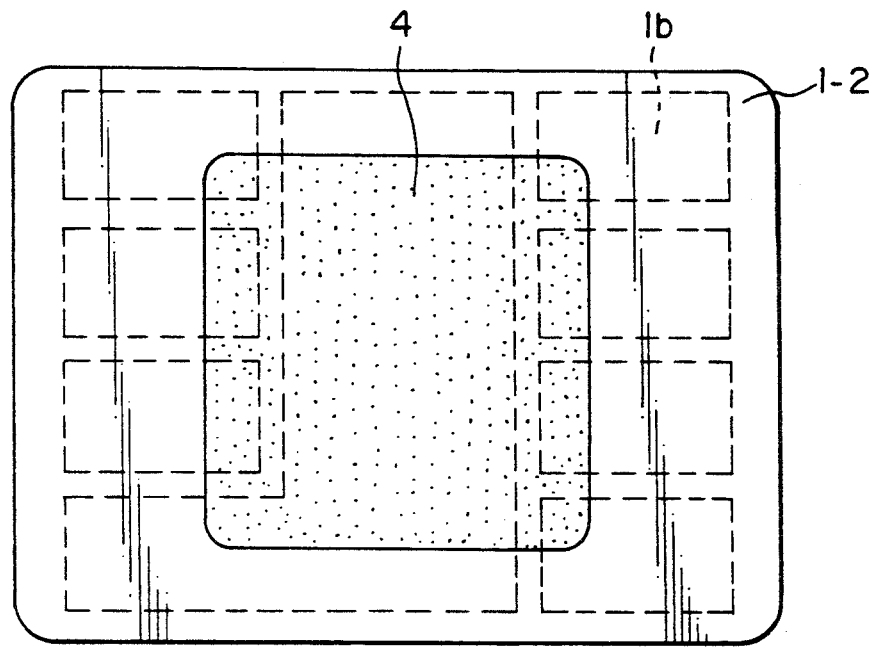
Figure 2B:
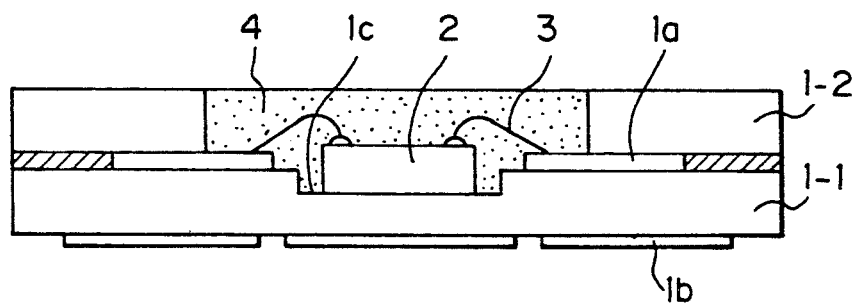
Figure 3A:
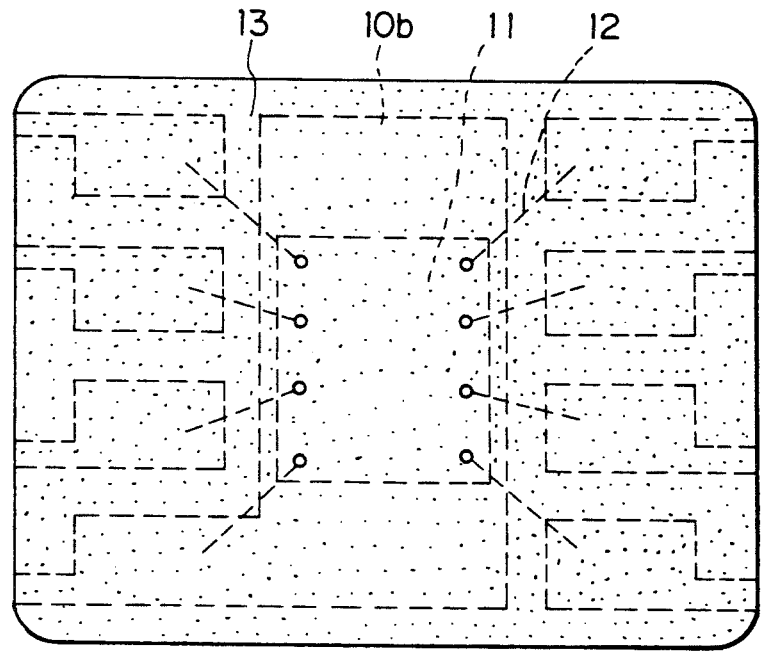
Figure 3B:
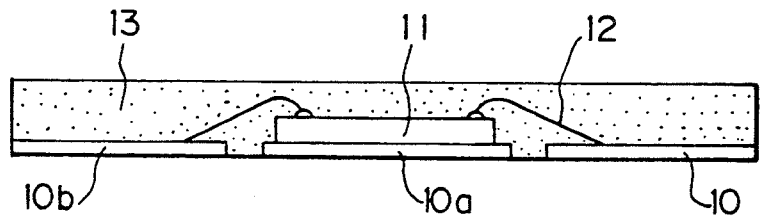
Figure 4A:
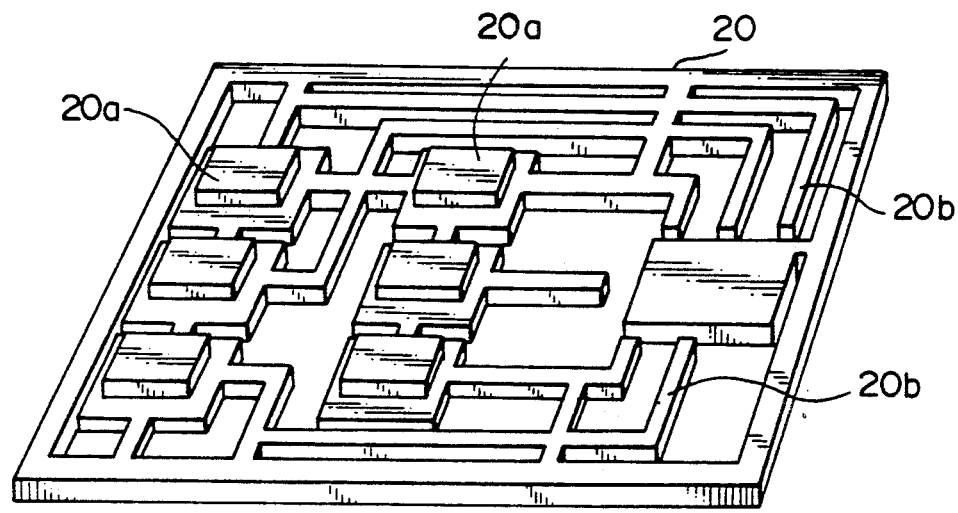
Figure 4B:
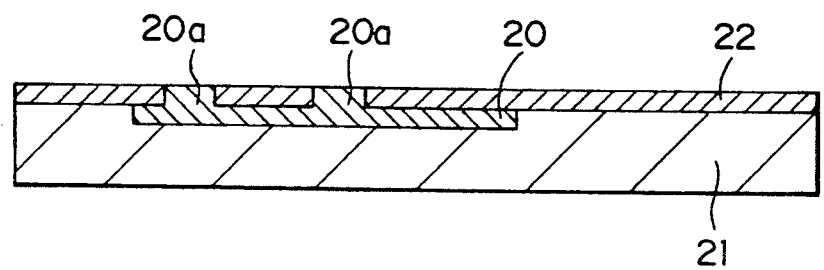
Figure 5A:
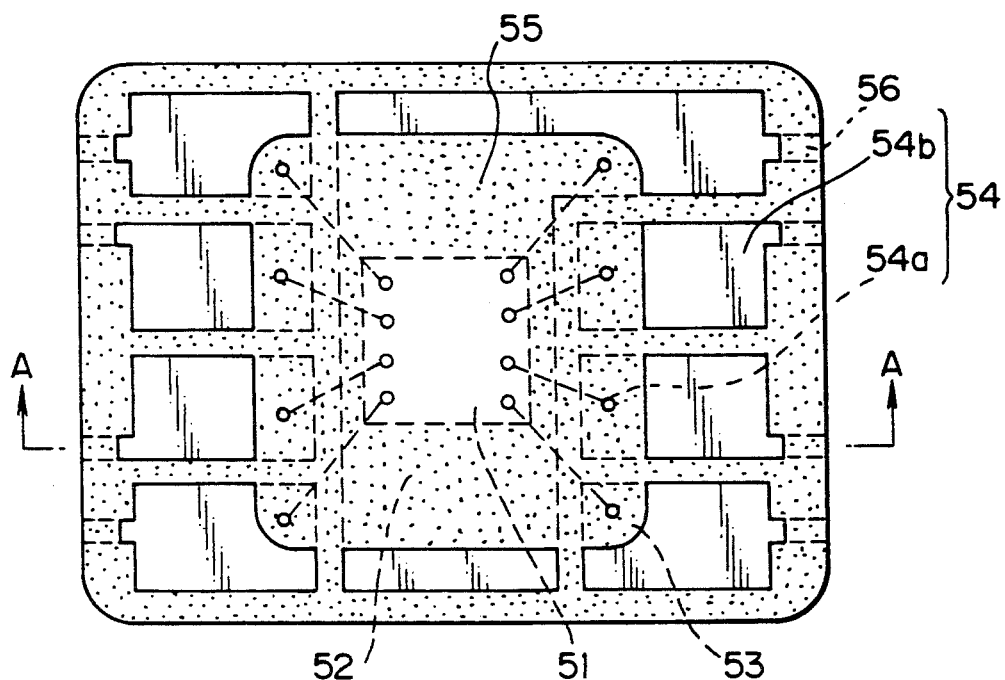
FIG. 5(a) is a plan view of a resin sealed semiconductor device in a first embodiment according to the present invention.
Figure 5B:
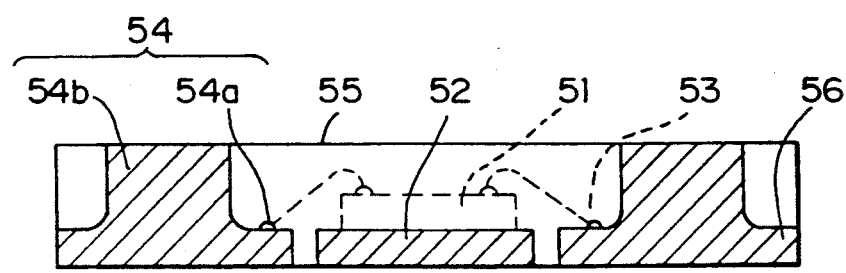
FIG. 5(b) is a sectional view taken on line A—A in FIG. 5(a)

Referring to FIGS. 5(a) and 5(b), a semiconductor chip 51 is fixed to the upper surface of a die pad 52 with an adhesive, such as a Ag paste, or a Au-Si eutectic.

The die pad 52 is a metal plate having a thickness in the range of 0.1 to 0.2 mm formed of a Cu alloy of 97.8% Cu, 2% Sn and 0.2% Ni, or a Fe alloy generally called a 42 alloy of 58% Fe and 42% Ni.

A plurality of leads 54 are arranged around the die pad 52 with their lower surfaces flush with the lower surface of the die pad 52. The leads 54 are connected to the semiconductor chip 51 with wires 53, such as Au wires.

Each lead 54 is formed of the same material as that of the die pad 52 and has a connecting portion 54a to which the wire 53 is connected, and a protruding portion 54b protruding from the connecting portion 54a.

The thickness of the connecting portion 54a of each lead 54 is equal to that of the die pad 52 and is formed near the die pad 52. The semiconductor chip 51, the die pad 52, the wires 53 and the connecting portions 54a of the leads 54 are sealed in an epoxy resin (hereinafter referred to simply as "resin") 55 by molding.

The upper surface of the protruding portion 54b of each lead 54 is not covered with the resin 55 and is flush with the upper surface of the resin 55, and the entire side surface facing the die pad 52 and the entire opposite side surface of the protruding portion 54b are coated closely with the resin 55. The thickness of the protruding portions 54b is, for example, in the range of 0.6 to 0.7 mm.

Small projections below the side surfaces of the protruding portions 54b opposite the side surfaces of the same, facing the die pad 52, are support bars 56 cut into the wafer cutting the wafer into a plurality of semiconductor devices so as to divide the semiconductor devices into individual semiconductor devices.

The resin 55 seals the semiconductor chip 51, the die pad 52, the wire 53 and the leads 54. The upper surface of the resin 55 is flush with the upper surfaces of the protruding portions 54b, and the lower surface of the same is flush with the lower surfaces of the die pad 52 and the leads 54. Thus the lower surfaces of the die pad 52 and the leads are exposed so as to serve as contact surfaces to be brought into contact with the conductors of an external device. The upper surfaces of the protruding portions 54b may be used as contact surfaces to be brought into contact with the conductor of an external device.

A process of fabricating the semiconductor device of such a construction will be described hereinafter with reference to FIGS. 6(a) to 6(d).

Figure 6A:
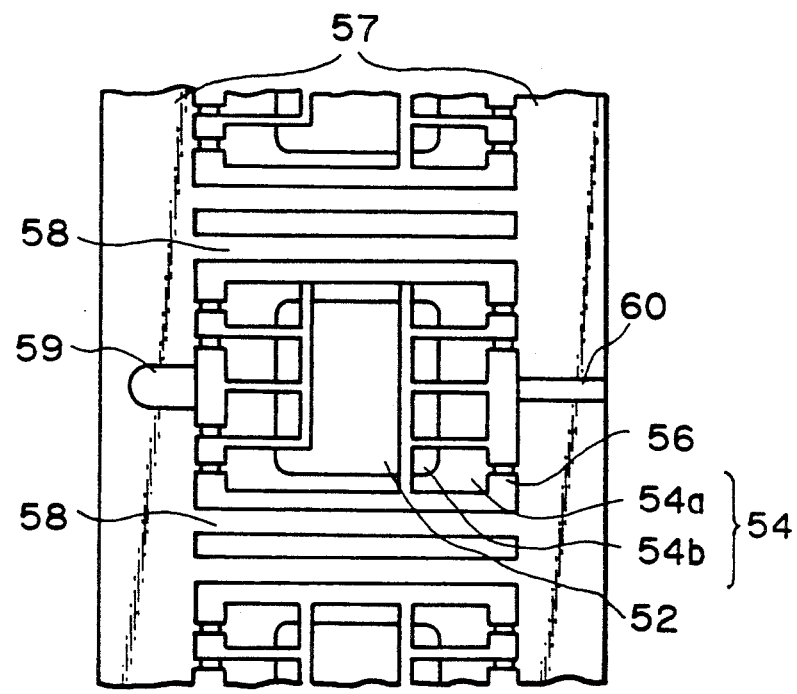
FIGS. 6(a) to 6(d) are views to assist in explaining a process of fabricating the semiconductor device of FIG. 5(a)

FIG. 6(a) shows a lead frame included in the semiconductor device.

The lead frame is formed, for example, of a Cu alloy of 97.8% Cu, 2% Sn and 0.2% Ni or a Fe alloy generally called 42 alloy of 58% Fe and 42% Ni. The lead frame has two substantially parallel first frame members 57, a plurality of second frame members 58 interconnecting the two first frame members 57, leads 54 formed between the second frame members 58, and support bars 56 supporting the leads 54. An injection gate 59 through which the resin 55 is injected, and an air vent 60 are formed respectively in the first frame members 57. One of the leads 54 has a die pad 52, a connecting portion 54a and a protruding portion 54b.

The die pad 52, the connecting portions 54a, the support bars 56 and portions of the first frame members 57 corresponding to the injection gate 59 and the air vent 60 (hereinafter, these portions will be referred to simply as "thin portions") are formed in a thickness far smaller than that of the first frame members 57 and the second frame members 58 by half-etching. For example, the thickness of the first frame members 57 and the second frame members is 0.7 mm, while that of the thin portions is 0.2 mm.

Figure 6B:
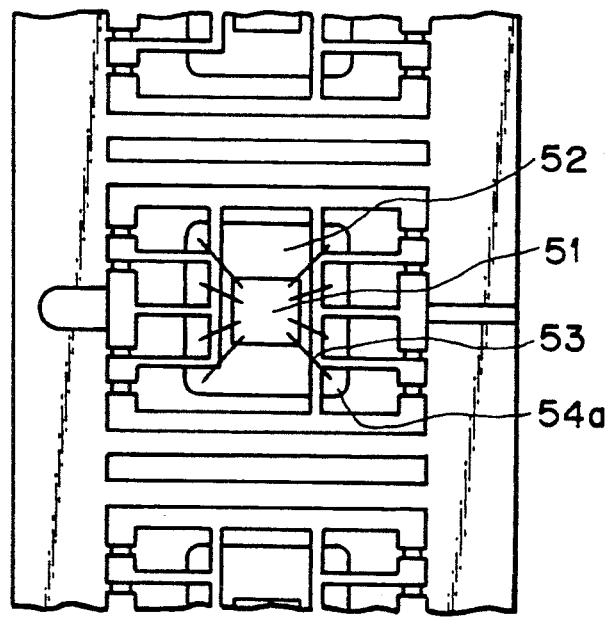

As shown in FIG. 6(b), a semiconductor chip 51 is fixed to the die pad 52 by an adhesive, such as a Ag paste, or a Au-Si eutectic, and is connected to the connecting portions 54a with wires 53, such as Au wires, by a conventional wire-bonding method.

After mounting the semiconductor chip 51 on the die pad 52 and wire-bonding the same to the leads 54, the lead frame is held between the upper and lower dies each having a flat molding surface of a molding die.

Figure 6C:
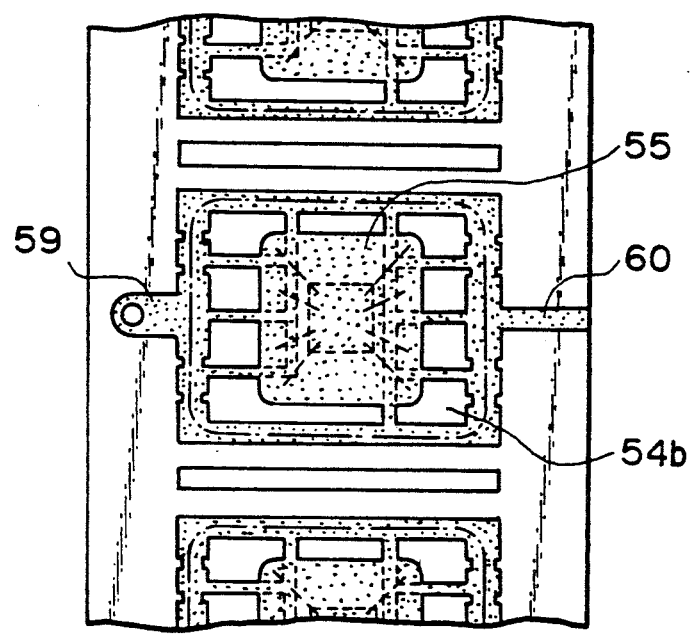

Then, as shown in FIG. 6(c), a resin 55, such as an epoxy resin, is injected into the molding die through the injection gate 59 while air is allowed to escape from the cavity of the molding die through the air vent 60 to enable the resin 55 to be molded satisfactorily in the cavity. Since the upper and lower surfaces of the protruding portion 54b are in close contact with the molding surfaces of the upper and lower dies, the resin 55 is unable to flow over the upper surface of the protruding portion 54b, the dislocation of the leads 54 by the pressure of the resin 55 injected into the molding die is suppressed so that the resin 55 may not flow over the the lower surfaces of the leads 54 and the molding surface of the lower die.

Figure 6D:
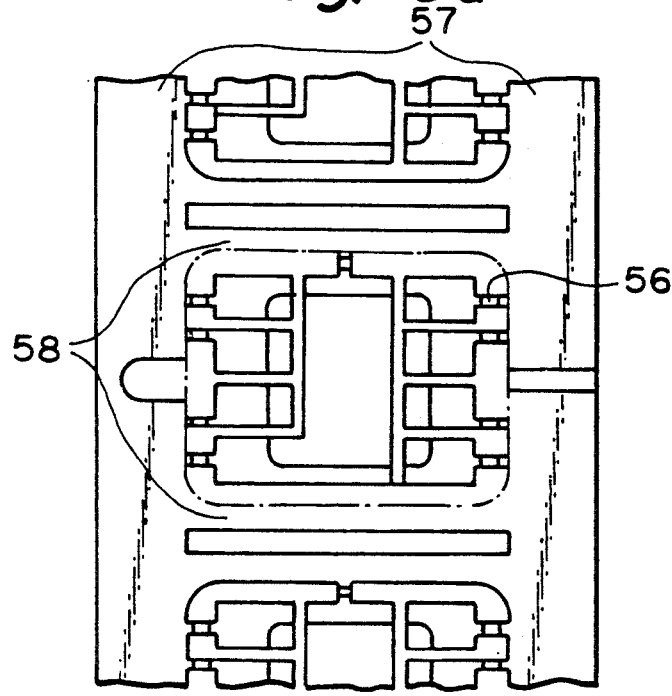

The lead frame is cut by punching or the like along the external boundary of the semiconductor device, indicated by alternate long and short dash lines in FIG. 6(d), to separate the individual semiconductor device as shown in FIGS. 5(a) and 5(b) from the lead frame.

In this embodiment, semiconductor device can be separated from the first frame members 57 and second frame members 58 of the lead frame simply by cutting the resin 55 and the support bars 56. Preferably, the first frame members 57 and the second frame members 58 are extended as shown in FIG. 6(d) along alternate long and short dash lines shown in FIG. 6(c). Such an arrangement of the first frame members 57 and the second frame members 58 reduces portions to be cut by punching and separating the semiconductor device from the lead frame, reduces load on the punching tool, and enables the support bars 56 to be of a relatively small length to increase the pattern density of the lead frame.

Figure 7A:
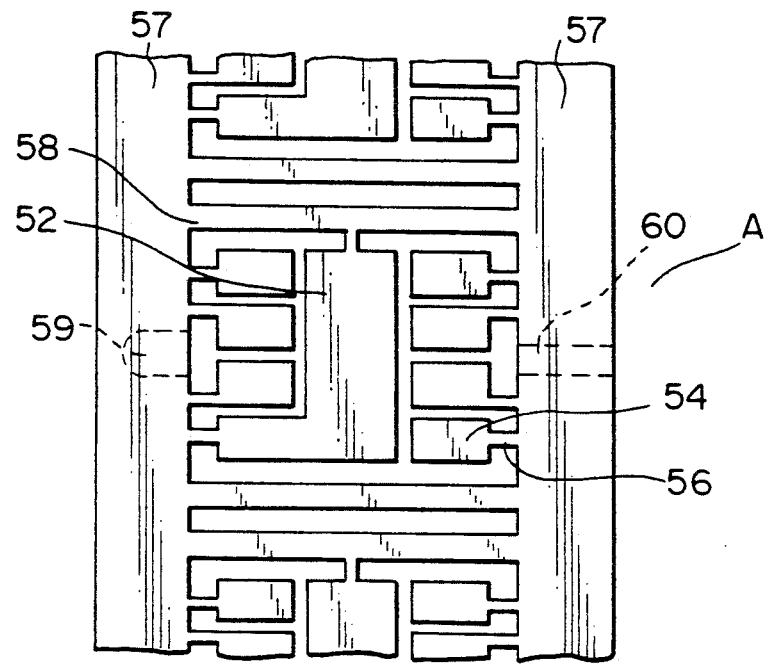
FIGS. 7(a) and 7(b) are plan views of lead frames employed in semiconductor devices in other embodiments according to the present invention, respectively.
Figure 7B:
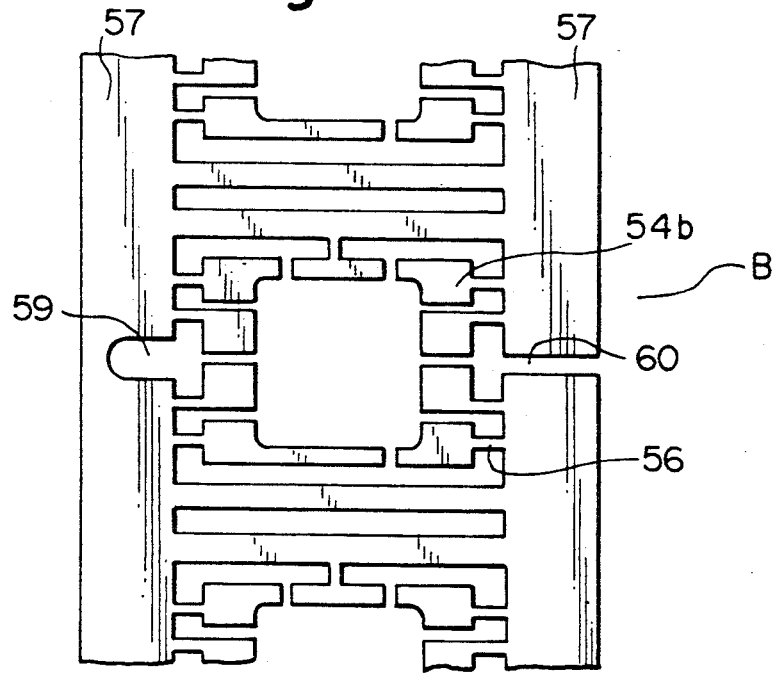

Another process of forming the thin portions including the die pad 52 of the lead frame will be described with reference to FIGS. 7(a) and 7(b).

Lead frames A and B have a thickness of 0.2 mm and a thickness of 0.5 mm, respectively.

The lead frame A has frame members 57 and 58, a die pad 52, leads 54 and support bars 56 and is formed by punching. An infection gate 59 and an air vent 60 are formed in the frame members 57, respectively.

The lead frame B has only protruding portions 54b, support bars 56 and frame members 57 and 58, and does not have the portions corresponding to the die pad 52 and connecting portions 54a. Portions of the lead frame B corresponding to the injection gate 59 and the air vent 60 are punched off.

The lead frame B is placed on the lead frame A, and then the lead frames A and B are bonded together by a conductive adhesive or welded together by spot-welding to obtain a composite lead frame having predetermined thin portions.

The upper surfaces of the die pad 52 and the connecting portions 54a of the composite lead frame, as compared with those formed by half-etching, have a high flatness, because the composite lead frame is formed by joining together the flat component lead frames A and B, so that the semiconductor chip 51 can be fixed satisfactorily to the die pad 52, and the wires 53 can be connected satisfactorily to the connecting portions 54a. Furthermore, since the corners are not rounded, the upper surfaces of the connecting portions 54a may be formed in relatively small areas, respectively, to form the semiconductor device in a relatively small size.

Figure 8A:
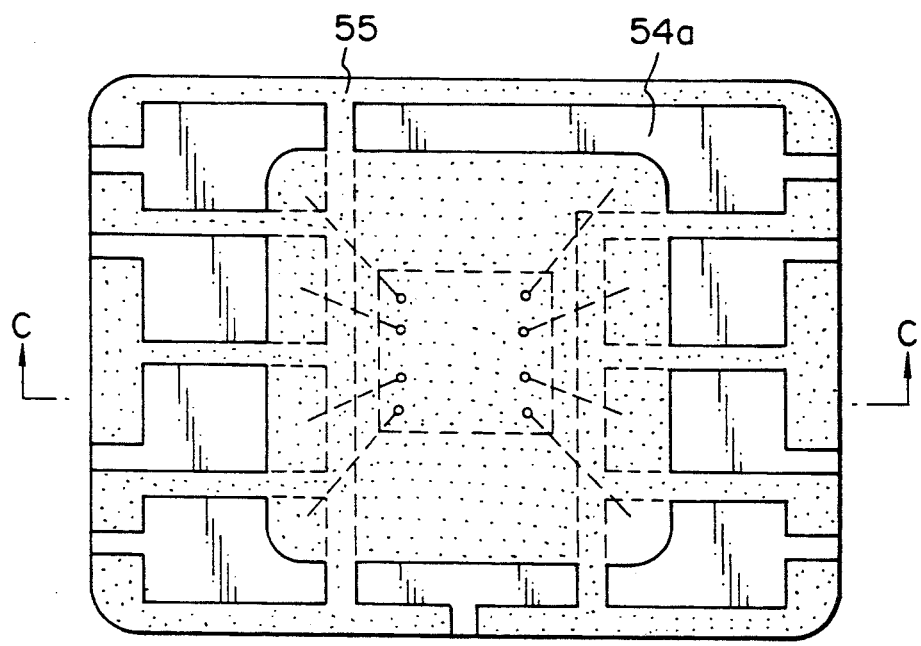
FIGS. 8(a) and 8(b) are a plan view and a sectional view, respectively, of a semiconductor device in a second embodiment according to the present invention.
Figure 8B:
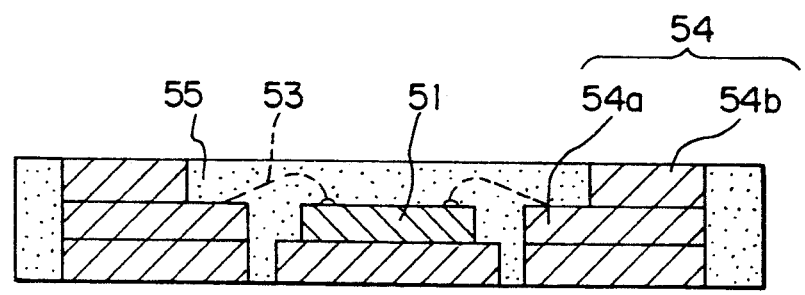

FIG. 8(a) is a plan view of a semiconductor device in a second embodiment according to the present invention and FIG. 8(b) is a sectional view taken on line C—C in FIG. 8(a).

The height of the upper surfaces of the connecting portions 54a is lower than that of the upper surface of the semiconductor chip 51 fixed to the die pad 52 in the embodiment previously described with reference to Figs. 5(a) and 5(b), however, the lead frame may be formed so that height of the upper surfaces of the connecting portions 54a and that of the semiconductor chip 51 as mounted on the die pad 52 are equal to each other. When the lead frame is thus formed, the possibility of slack wires accidentally contacting the die pad 52 can be eliminated. A lead frame of such a construction can be formed by half-etching or by laminating three component lead frames.

Figure 9A:
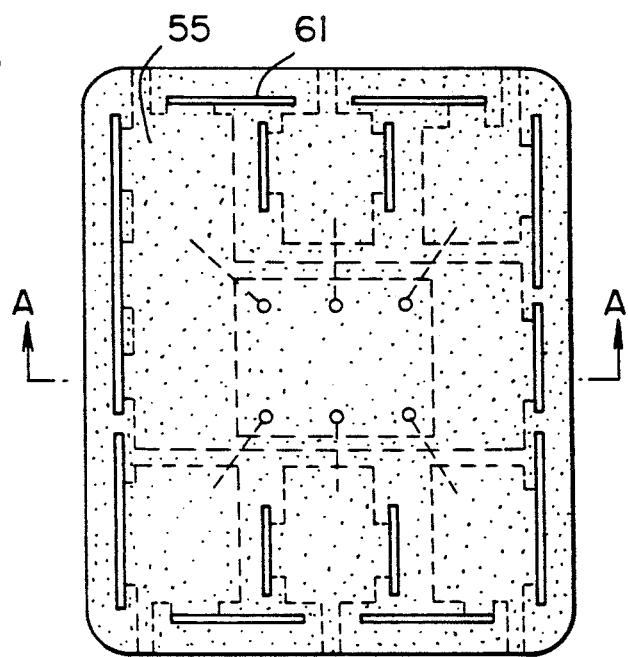
FIGS. 9(a) to 9(c) are a top plan view, a bottom plan view and a sectional view of a semiconductor device in a third embodiment according to the present invention.
Figure 9B:
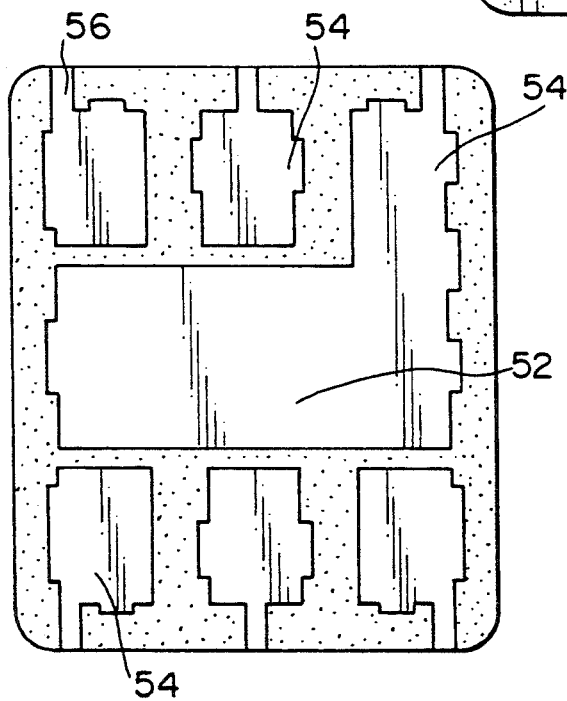
Figure 9C:
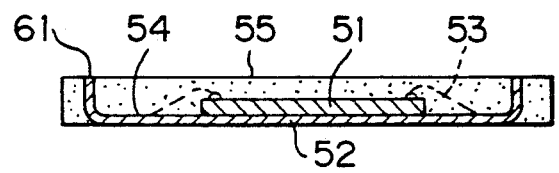

FIG. 9(a) is a top plan view of a semiconductor device in a third embodiment according to the present invention, FIG. 9(b) is a bottom plan view of the semiconductor device of FIG. 9(a), and FIG. 9(c) is a sectional view taken on line A—A in FIG. 9(a).

Referring to FIGS. 9(a) to 9(c), a semiconductor chip 51 fixed to the upper surface of a die pad 52 is connected to a plurality of leads 54 with wires 53. The semiconductor chip 51, the die pad 52, the leads 54 and the wires 53 are sealed in a resin 55 by molding with the bottom surfaces of the leads 54 and the upper surfaces of the extended portions 61 of the leads 54 exposed.

A process of fabricating the semiconductor device shown in FIGS. 9(a) to 9(c) will be described with reference to FIGS. 10(a) to 10(d).

Figure 10A:
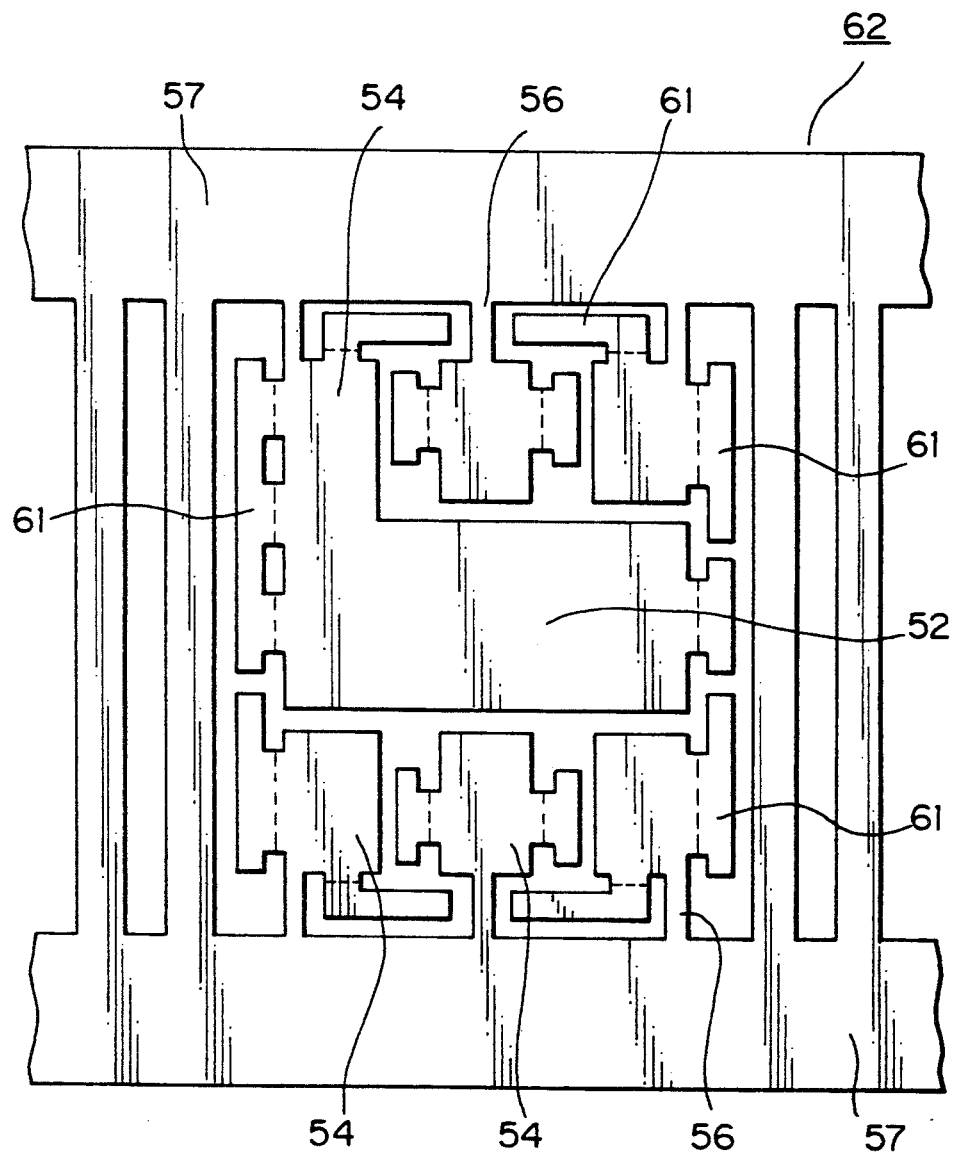
FIGS. 10(a) to 10(d) are views to assist in explaining a process of fabricating the semiconductor device of FIGS. 9(a) to 9(c)

FIG. 10(a) is a plan view of a lead frame 62 employed in the semiconductor device of FIGS. 9(a) to 9(c). As shown in FIG. 10(a), the lead frame 62 is formed by half-etching or pressing a metal plate, such as a Cu alloy plate or a Fe alloy plate, of the thickness in the range of 0.1 to 0.2 mm. The lead frame 62 has two substantially parallel frame members 57, a die pad 52 disposed between the two frame members 57, rectangular leads 54 arranged around the die pad 52, and support bars 56 supporting the die pad 52 and the leads 54. Each lead 54 has extended portions 61 extending toward the adjacent leads 54. The extended portion 61 are bent upright at right angles at broken lines. Recesses are formed in the opposite ends of each extended portion 61 to facilitate bending the extended portion 61. The die pad 52, similarly to the leads 54, is provided with extended portions 61.

Figure 10B:
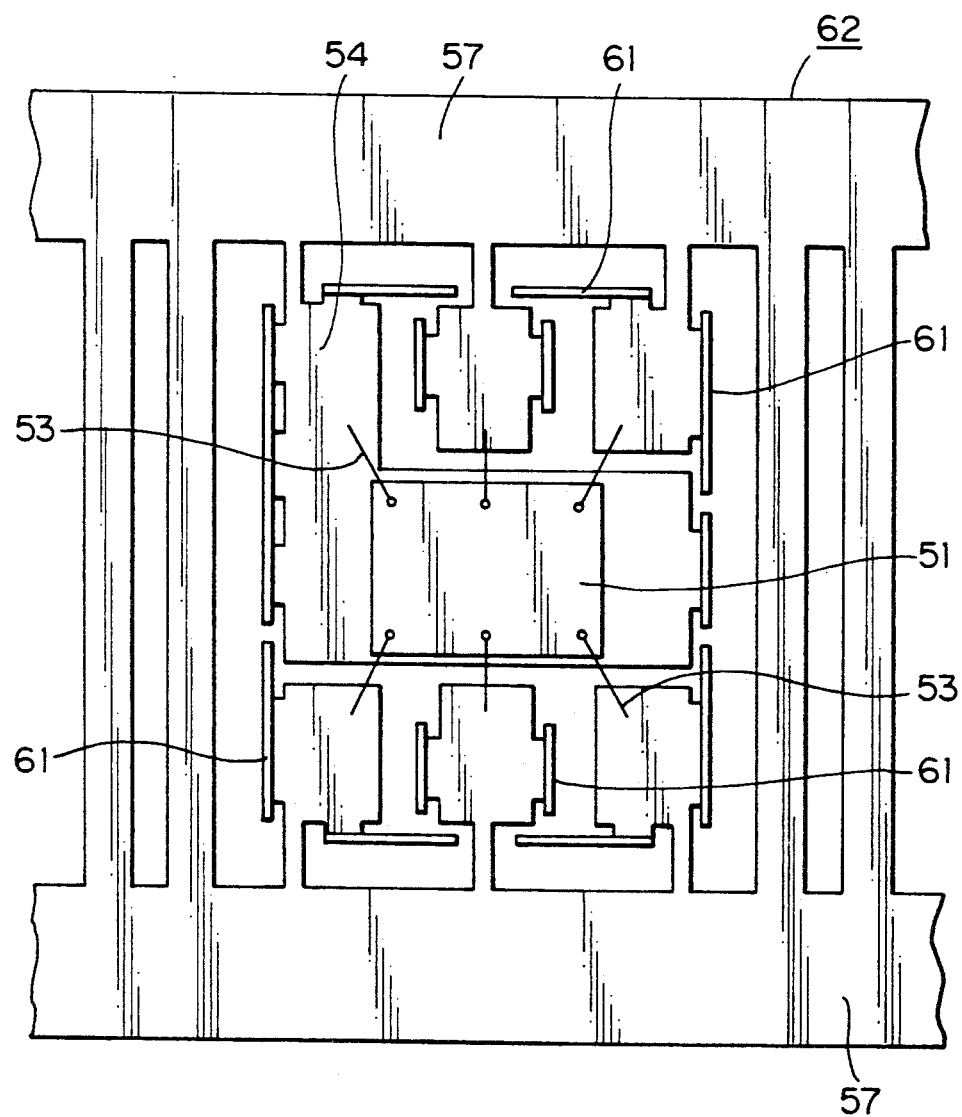

FIG. 10(b) is a plan view of the lead frame as mounted with a semiconductor chip. As shown in FIG. 10(b), the extended portions 61 are bent upright at right angles, a semiconductor chip 51 is fixed to the upper surface of the die pad 52 of the lead frame by an adhesive, such as a Ag paste, or by a Au-Si eutectic, and then the terminals of the semiconductor chip 51 are connected to the upper surfaces of the leads 54 by wires 53, respectively.

Figure 10C:
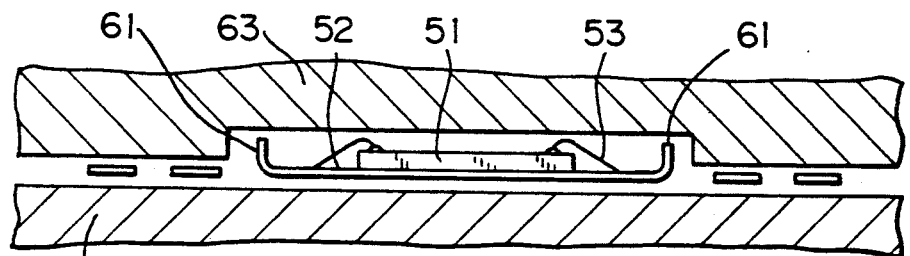
Figure 10D:
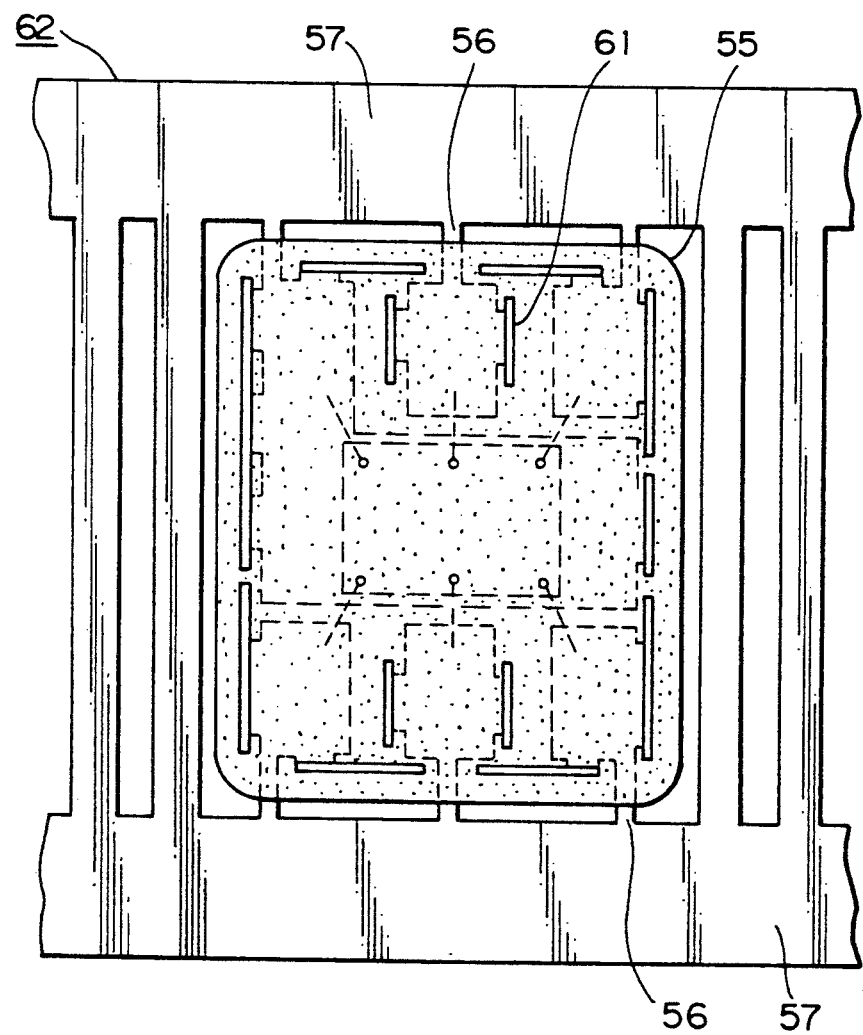

As shown in FIG. 10(c), the lead frame 62 mounted with the semiconductor chip 51 is set between the upper die 63 and lower die 64 of a molding die so as to hold the lead frame 62 between the upper die 63 and the lower die 64 for molding. In this state, the frame members 57 are held fixedly between the upper die 63 and the lower die 64, and the leads 54 and the extended portions 61 of the die pad 52 are pressed downward by the upper die 63, so that the lower surfaces of the leads 54 and the die pad 52 are pressed closely and securely against the lower die 64. Then, a sealing material 55, such as a melted resin, is injected through an injection gate, not shown, formed in the upper die 63 into the cavity of the molding die to seal the die pad 52, the leads 54, the semiconductor chip 51 and the wires 53 in the sealing material 55 as shown in FIG. 10(d). Spaces between the leads 54 are filled up with the sealing material 55.

Subsequently, the thus sealed semiconductor device is removed from the molding die consisting of the upper die 63 and the lower die 64, and the support bars 56 are cut by pressing or the like to obtain a molded semiconductor device as shown in FIGS. 9(a) to 9(c). The upper surfaces of the extended portions 61 are exposed in the upper surface of the semiconductor device, and the lower surface of the die pad 52 and the leads 54 are exposed in the lower surface of the semiconductor device. When the semiconductor device is incorporated into an IC card or the like, the exposed lower surfaces of the lead 54 serve as terminals to be brought into contact with an external device.

Thus the lead frame 62 and the semiconductor device employing the lead frame 62 have the following advantages.

(i) Since the extended portions 61, namely, portions of the die pad 52 and the leads 54, are bent upright, the lower surfaces of the die pad 52 and the leads 54 can be fixedly held in close contact with the lower die 64 by pressing down the extended portions 61 by the upper die 63 to prevent the melted sealing material from flowing over the lower surfaces of the die pad 52 and the leads 54, so that the lower surfaces of the leads 54, in particular, are not coated with a thin film of the sealing material 55.

(ii) Since the recesses formed in the opposite ends of each of the extended portions 61 of the die pad 52 and the leads 54 are filled up with the sealing material 55, the separation of the leads 54 particularly from the bottom surface of the sealing material can be prevented by the anchoring effect of the sealing material 55 filling up the recesses to improve the reliability of the semiconductor device.

(iii) The extension of the extended portions 61 toward the adjacent leads 54 prevents portions of the sealing material filling up the spaces between the leads 54 from fissuring. Moreover, the extended portions 61 serve as a framework to enhance the mechanical strength of the semiconductor device remarkably, which enables the semiconductor device to be formed in a very small thickness without entailing the deterioration of the reliability.

(iv) The lead frame 62, as compared with the conventional lead frame having a comparatively large thickness, can simply be manufactured without increasing the steps of the manufacturing process at high productivity.

FIG. 11(a) is a sectional view of a semiconductor device in a fourth embodiment according to the present invention, and FIGS. 11(b) and 11(c) are a top plan view and a bottom plan view, respectively, of the semiconductor device of FIG. 11(a).

Referring to FIGS. 11(a) to 11(c), a semiconductor chip 51 is fixed to the upper surface of a die pad 52 and is connected to a plurality of leads 54 with wires 53. Insulating reinforcing members 65 are held by the leads 54 and extended portions 61 of the leads 54 by holding the extended portions 61. These components are sealed in a resin 55 by molding with the lower surfaces of the leads 54 and the upper surfaces of the extended portions 61 exposed. A process of fabricating this semiconductor device will be described hereinafter with reference to FIGS. 12(a) to 12(e).

Figure 12A:
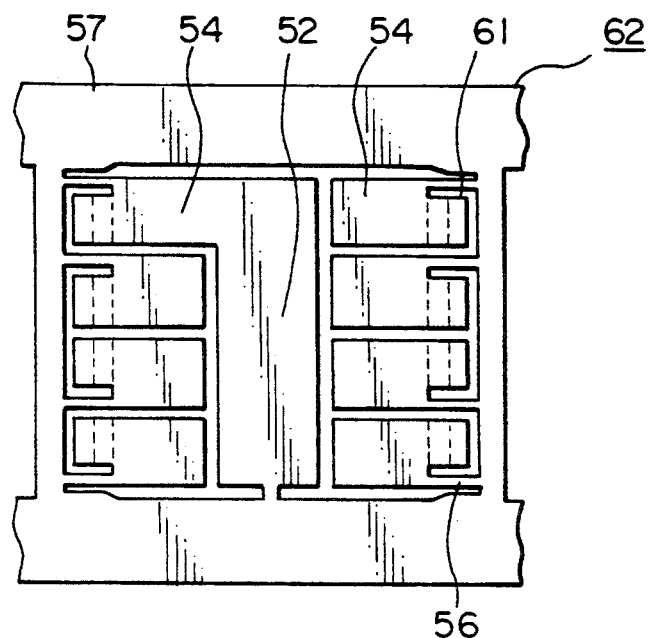
FIG. 12(a) to 12(d) are views to assist in explaining a process of fabricating the semiconductor device of FIGS. 11(a) to 11(c)

Referring to FIG. 12(a), a lead frame 62 having the die pad 52, the leads 54 having the extended portions 61, support bars 56 and frame members 57 is formed through processing means, such as selective etching or stamping. The extended portions 61 are bent at about 90° at broken lines to secure the insulating reinforcing members 65 to the lead frame 62.

Figure 12B:
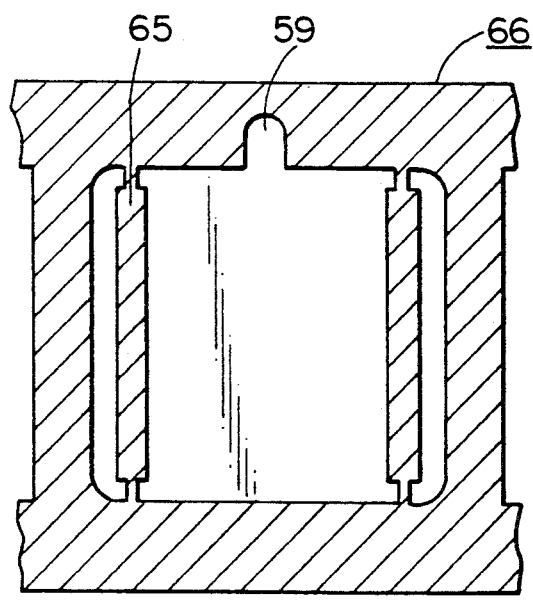

As shown in FIG. 12(b), the insulating reinforcing members 65 are formed on a molded insulating frame 66 formed of a metal oxide, such as alumite, or a resin and is provided with an injection gate 59 through which a resin 55 is injected into a molding die.

Figure 12C:
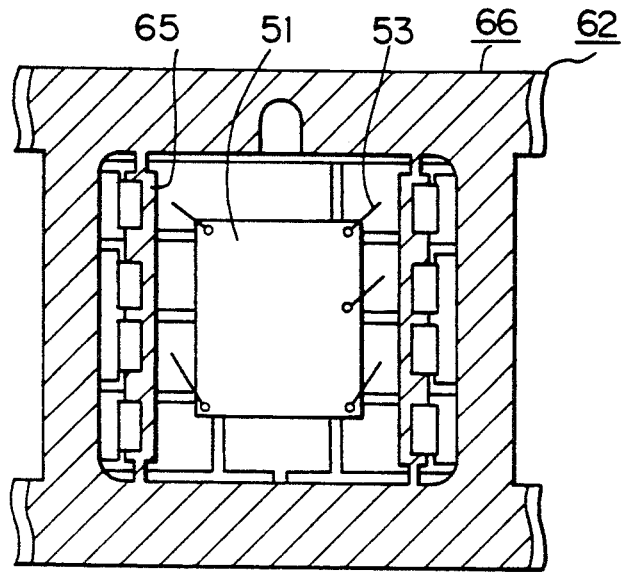

Referring to FIG. 12(c), the insulating frame 66 is placed on the lead frame 62, and then the extended portions 61 are folded firmly round the insulating reinforcing members 65, the semiconductor chip 51 is fixed to the upper surface of the die pad 52, and then the semiconductor chip 51 is connected to the leads 54 with wires 53.

Figure 12D:
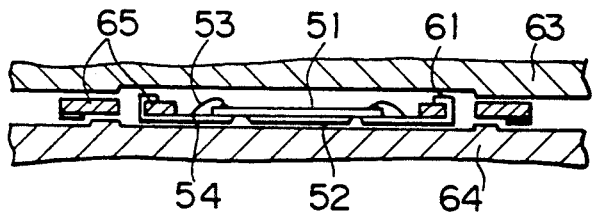

Then, as shown in FIG. 12(d), the assembly of the semiconductor chip 51, the lead frame 62 and the insulating frame 66 is set between the upper die 63 and lower die 64 of a molding die to seal the assembly by an epoxy resin or the like by molding. Since the extended portions 61 and the insulating reinforcing members 65 are pressed down by the upper die 63, the leads 54 are pressed against the lower die 64 in perfectly close contact with the lower die 64, so that the resin is unable to flow over the lower surfaces of the leads 54 and hence the lower surfaces of the leads 54 are not coated with a thin film of the resin.

Figure 12E:
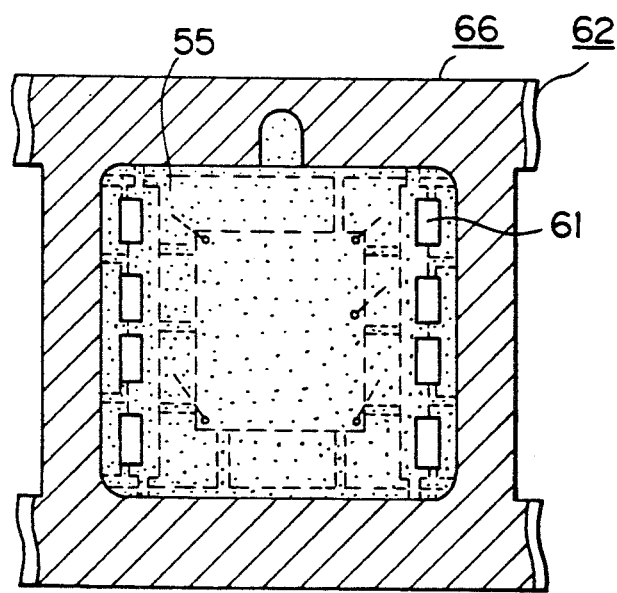

FIG. 12(e) is a plan view of the semiconductor device sealed in the resin 55 with the lower surfaces of the die pad 52 and the leads 54, and the upper surfaces of the extended portions 61 exposed.

Since the leads 54 of this semiconductor device are held securely in place by the insulating reinforcing members 65, portions of the resin 55 filling up spaces between the leads 54 are prevented from fissuring and the separation of the leads 54 from the resin 55 is prevented. Furthermore, this semiconductor device can be selected by placing a probe or the like in direct contact with the surface of the exposed extended portion 61, and the bottom surfaces of the leads 54 are used as terminals to be connected to an external device to prevent problems in appearance, such as scratches.

The semiconductor device is separated from the frame members 57 and the insulating frame 66 to obtain the sealed semiconductor device sealed by molding as shown in FIGS. 11(a) to 11(c).

The present invention is not limited in its practical application to the specific embodiments illustrated in the drawings and many modifications are possible therein. Possible modifications are as follows.

(1) The present invention is applicable to semiconductor devices fabricated by a process employing wireless bonding as well as to those shown in the drawings. For example, a semiconductor device of a wireless bonding type can be obtained by forming the die pad 52 of FIGS. 5(a) and 5(b) in a small width or omitting the same, arranging the opposite rows of the leads 54 closer to each other, and directly connecting a semiconductor chip provided with bump electrodes to the leads 54 by bonding the bump electrodes to the leads 54. Such a configuration simplifies the construction of the semiconductor device and enables the semiconductor device to be formed in a very small thickness.

(2) The two insulating reinforcing members 65 having the shape of a bar as shown in FIGS. 11(a) to 11(c) may be substituted by a U-shaped insulating reinforcing member as shown in FIG. 13(a) or an insulating reinforcing member having the shape of a rectangular frame as shown in FIG. 13(b).

CAPABILITY OF EXPLOITATION IN INDUSTRY

As is apparent from the foregoing description, the leads and the resin of the resin-sealed semiconductor device in accordance with the present invention are bonded firmly together to prevent the separation of the leads from the resin, the exposed surfaces of the leads are not coated with a thin film of the resin, and portions of the resin filling up spaces between the leads has a high mechanical strength. Accordingly, the resin-sealed semiconductor device can very effectively be applied to wrist watches, cameras and IC cards, which require thin, compact semiconductor devices.

I claim:
1. A semiconductor device comprising:
   a semiconductor chip having a semiconductor element therein, said chip having a first thickness;
   a die pad having said semiconductor chip mounted thereon, said die pad having a second thickness;
   a conductive lead located adjacent to said die pad and having a first and second portion, said first portion having a third thickness greater than the sum of said first and second thicknesses;
   a conductor electrically interconnecting said semiconductor element and said conductive lead; and
   a sealing material sealing said semiconductor chip, die pad, conductor and conductive lead second portion, a portion of said sealing material overlying said semiconductor chip, said sealing material portion having a fourth thickness which is dependent on said third thickness of said conductive lead.

2. The device according to claim 1 wherein said third thickness is substantially equal to the sum of the first, second and fourth thicknesses.

3. The device according to claim 1 wherein said first portion of said conductive lead is effective as a barrier for said sealing material.

4. The device according to claim 1 wherein said second portion of said conductive lead which is covered by said sealing material is less thick than said first portion.

5. The device according to claim 4 wherein said sealing material and said second portion of said conductive leads have respective upper surfaces that are substantially co-planar, said semiconductor chip having an upper surface located below the upper surface of said molded insulator.

6. The device according to claim 5 wherein said conductive lead and said die pad have lower surfaces that are substantially co-planar.

7. The device according to claim 1 wherein said second portion of said conductive lead comprises a holding portion securely holding an insulating reinforcing member and wherein said holding portion has said third thickness.

8. A semiconductor device comprising:
   a semiconductor chip having a semiconductor element therein, said chip having a first thickness;
   a die pad having said semiconductor chip mounted thereon, said die pad having a second thickness;
   a conductive lead located adjacent to said die pad and having a first portion and a second portion, the first portion having a third thickness greater than the sum of the first and second thicknesses;
   a conductor electrically interconnecting the semiconductor element and said conductive lead; and
   a molded insulator encapsulating said semiconductor chip, die pad, conductor and conductive lead second portion, said molded insulator having a fourth thickness overlying said semiconductor chip, said fourth thickness a function of said third thickness of said conductive lead.

9. The device according to claim 8 wherein said third thickness is substantially equal to the sum of the first, second and fourth thicknesses.

10. The device according to claim 8 wherein said first portion of said conductive lead is effective as a barrier for said insulator.

11. The device according to claim 10 wherein said second portion of said conductive lead is less thick than said first portion.

12. The device according to claim 11 wherein said molded insulator and said second portion of said conductive leads have respective upper surfaces that are substantially co-planar, said semiconductor chip having an upper surface located below the upper surface of said molded insulator.

13. The device according to claim 12 wherein said conductive lead and said die pad have lower surfaces that are substantially co-planar.

14. The device according to claim 8 wherein said first portion of said conductive lead comprises a holding portion securely holding an insulating reinforcing member and wherein said holding portion constitutes the third thickness.

* * * * *